(12) United States Patent
Kraft et al.

(10) Patent No.: US 11,222,834 B2
(45) Date of Patent: Jan. 11, 2022

(54) PACKAGE WITH ELECTRICAL PATHWAY

(71) Applicant: Analog Devices International Unlimited Company, Limerick (IE)

(72) Inventors: Jonathan Kraft, Frederick, CO (US); David Aherne, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 14 days.

(21) Appl. No.: 16/749,855

(22) Filed: Jan. 22, 2020

(65) Prior Publication Data

US 2020/0303292 A1    Sep. 24, 2020

Related U.S. Application Data

(60) Provisional application No. 62/822,689, filed on Mar. 22, 2019.

(51) Int. Cl.
| | |
|---|---|
| *H01L 23/498* | (2006.01) |
| *H01L 25/18* | (2006.01) |
| *H01L 23/00* | (2006.01) |
| *H01L 23/13* | (2006.01) |

(52) U.S. Cl.
CPC ........ *H01L 23/49822* (2013.01); *H01L 23/13* (2013.01); *H01L 24/45* (2013.01); *H01L 25/18* (2013.01)

(58) Field of Classification Search
CPC ................................................. H01L 23/49822
See application file for complete search history.

(56) References Cited

U.S. PATENT DOCUMENTS

| | | | | |
|---|---|---|---|---|
| 5,691,568 A | * | 11/1997 | Chou | ................ H01L 23/49822 257/691 |
| 5,714,801 A | | 2/1998 | Yano et al. | |
| 6,087,680 A | * | 7/2000 | Gramann | ............ H01L 25/0753 257/91 |
| 6,828,888 B2 | * | 12/2004 | Iwata | ................ H01H 59/0009 200/181 |
| 6,864,565 B1 | * | 3/2005 | Hool | .................... H01L 23/525 257/666 |
| 7,183,643 B2 | | 2/2007 | Gibson et al. | |

(Continued)

FOREIGN PATENT DOCUMENTS

| | | |
|---|---|---|
| JP | 11-067958 | 3/1991 |
| JP | 8-330474 | 12/1996 |

(Continued)

OTHER PUBLICATIONS

Japanese Office Action issued in application No. JP 2020-049556 dated Mar. 22, 2021.

*Primary Examiner* — Nicholas J Tobergte
(74) *Attorney, Agent, or Firm* — Knobbe, Martens, Olson & Bear LLP

(57) ABSTRACT

A package with a laminate substrate is disclosed. The laminate substrate includes a first layer with a first terminal and a second terminal. The laminate substrate also includes a second layer with a conductive element. The laminate substrate further includes a first via and a second via that electrically connect the first terminal to the conductive element and the second terminal to the conductive element, respectively. The package can include a die mounted on and electrically connected to the laminate substrate.

20 Claims, 13 Drawing Sheets

(56) References Cited

U.S. PATENT DOCUMENTS

| | | | |
|---|---|---|---|
| 7,547,630 B2 | 6/2009 | Gerber | |
| 7,566,960 B1 * | 7/2009 | Conn | H01L 23/055 257/678 |
| 7,665,207 B2 * | 2/2010 | Fraley | H01L 23/5383 29/834 |
| 7,884,466 B2 | 2/2011 | Ishihara et al. | |
| 7,952,182 B2 * | 5/2011 | Watts | H01L 25/105 257/686 |
| 8,324,725 B2 | 12/2012 | Khandros et al. | |
| 8,330,264 B2 | 12/2012 | Sun et al. | |
| 8,492,197 B2 * | 7/2013 | Cho | H01L 24/14 438/108 |
| 8,617,990 B2 * | 12/2013 | Mallik | H05K 1/116 438/668 |
| 8,716,873 B2 * | 5/2014 | Wang | H01L 23/4952 257/778 |
| 2002/0171138 A1 * | 11/2002 | Osone | H01L 23/49822 257/712 |
| 2003/0020155 A1 * | 1/2003 | Shinonaga | H01L 25/50 257/691 |
| 2007/0040255 A1 * | 2/2007 | Osone | H01L 23/3677 257/678 |
| 2010/0289145 A1 * | 11/2010 | Chipalkatti | H01L 23/36 257/758 |
| 2012/0018892 A1 * | 1/2012 | Soltan | H01L 24/73 257/773 |
| 2012/0153495 A1 * | 6/2012 | Mallik | H01L 23/49838 257/774 |

FOREIGN PATENT DOCUMENTS

| | | |
|---|---|---|
| JP | 11-176987 | 7/1999 |
| JP | 2002-009197 | 1/2002 |
| JP | 2016-115727 A | 6/2016 |

* cited by examiner

PACKAGE WITH ELECTRICAL PATHWAY

CROSS-REFERENCE TO RELATED APPLICATIONS

This application claims the benefit of U.S. Provisional Application No. 62/822,689 entitled "PACKAGE WITH ELECTRIC PATHWAY," filed Mar. 22, 2019, the entire disclosure of which is incorporated herein by reference for all purposes.

BACKGROUND

Field

This application relates to packages, and more particularly, to packages with an electrical pathway.

Description of the Related Art

A device or a package can include a die mounted to a substrate. The device or the package can be mounted to, for example, a system board or motherboard, which can comprise a printed circuit board (PCB), in order to connect to a larger electronic system. When multiple devices or packages are mounted to the system board, the multiple devices or packages can be connected though traces in or on the system board.

SUMMARY

For purposes of summarizing the disclosure, certain aspects, advantages, and novel features of the innovations have been described herein. It is to be understood that not necessarily all such advantages can be achieved in accordance with any particular embodiment. Thus, the innovations described herein can be embodied or carried out in a manner that achieves or optimizes one advantage or group of advantages as taught herein without necessarily achieving other advantages as can be taught or suggested herein.

In one aspect, an integrated device package is disclosed. The integrated device package includes a laminate substrate. The laminate substrate includes a first layer that has a first terminal and a second terminal, a second layer that has a conductive element, a first via that electrically connects the first terminal to the conductive element, and a second via that electrically connects the second terminal to the conductive element to electrically couple the first terminal and the second terminal within the laminate substrate. The integrated device package also includes a die mounted on and electrically connected to the laminate substrate.

In one embodiment, the laminate further includes a top layer having a pad that is electrically coupled to the first terminal, and the pad is electrically connected to the die.

In one embodiment, the conductive element of the second layer includes a metal trace.

In one embodiment, the conductive element of the second element is a metal plate.

In one embodiment, the laminate further includes a third layer comprising a second conductive element In one embodiment, the first layer comprises a first conductive plate. The laminate substrate can include a third layer that has a second conductive plate. The second conductive plate can be thermally coupled to the first conductive plate. The first conductive plate can include a thermally conductive paddle. The thermally conductive paddle can be exposed on a bottom surface of the laminate substrate. The bottom surface is opposite to a top surface of the laminate substrate, and the die is mounted on the top surface. The laminate substrate comprises a second conductive plate that is disposed between the die and the second layer of the laminate substrate. The second conductive plate can be electrically coupled to the first conductive plate.

In one embodiment, the first layer includes a third terminal and a fourth terminal, the second layer includes a second conductive element, and the third terminal and the fourth terminal are electrically coupled through the second conductive element.

In one embodiment, the first layer includes a third terminal and a fourth terminal. The first, second, third, and fourth terminals can be electrically coupled though the conductive element of the second layer.

In one embodiment, the first terminal is connected to a terminal of another integrated device package though a jumper such that the terminal of the other package, the first terminal, and the second terminal are electrically coupled. The jumper can include a surface trace.

In one embodiment, the die comprises a switch die. The switch die includes a quad single pole single-throw (SPST) die. The integrated device package can further include a second die that is disposed over the first die. The second die can include a controller that is configured to control the first die. The controller can include a serial-parallel interface (SPI) converter. The integrated device package can further include a third die that is disposed between the first and second dies. The third die includes a second quad SPST die, and the second die can be configured to control the third die.

In one aspect, a laminate substrate is disclosed. The laminate substrate includes a first layer that has a first terminal and a second terminal, a second layer that has a conductive element, a third layer that has a pad and is configured to connect to an integrated device die, a first via that electrically connects the first terminal to the conductive element, and a second via that electrically connects the second terminal to the conductive element.

In one embodiment, the conductive element of the second layer includes a metal trace.

In one embodiment, the laminate substrate further includes a third layer that has a second conductive element.

In one aspect, an integrated device package is disclosed. The integrated device package includes a laminate substrate that has a top surface and a bottom surface opposite the top surface. The laminate substrate includes a first terminal and a second terminal on the bottom surface. The laminate substrate also includes a pad on the top surface, and an electrical pathway for electrically coupling the first and second terminals. The integrated device package also includes a die that is electrically connected to the pad on the top surface of the laminate substrate.

In one embodiment, the electrical pathway includes a first via and a conductive element that is electrically coupled with the first via and the first terminal such that the conductive element and the first terminal are electrically connected by way of the first via. The electrical pathway can further includes a second via that is electrically connecting the conductive element and the second terminal.

In one aspect, a system is disclosed. The system includes a system board that has a surface trace, a first integrated device package that is mounted to the system board, and a second integrated device package that is mounted to the system board. The second integrated device package is electrically coupled to the first integrated device package though the surface trace. Each of the first integrated device package and the second integrated device package includes a laminate substrate that has an embedded electrical pathway and a die that is mounted to the laminate substrate. The embedded electrical pathway of each of the first and second integrated device packages is electrically connected to the surface trace by a corresponding terminal. The system is configured to transfer a signal applied to the first integrated device package to the second integrated device package.

In one embodiment, the corresponding terminal of the first integrated device package includes a first output terminal and the first integrated device package further includes a first input terminal electrically connected to the electrical pathway of the first integrated device package. The first input terminal can be configured to receive a signal and the first output terminal can be configured to transmit the signal to the second integrated device package by way of the surface trace. The corresponding terminal of the second integrated device package includes a second input terminal. The second integrated device package can further includes a second output terminal that is electrically connected to the electrical pathway of the second integrated device package. The second input terminal can be configured to receive the signal from the first integrated device package by way of the surface trace. The second output terminal can be configured to transmit the signal to a third integrated device package that is mounted to the system board by way of a second surface trace.

In one aspect, a system is disclosed. The system includes a system board that has a trace, and a first integrated device package that is mounted to the system board. The first integrated device package includes a first laminate substrate that has a first terminal, a second terminal, and a first electrical pathway. The system also includes a second integrated device package that is mounted to the system board. The second integrated device package includes a second laminate substrate that has a third terminal, a fourth terminal and a second electrical pathway. Each of the first electrical pathway and the second electrical pathway is embedded in the first integrated device package and the second integrated device package respectively. The first and second electrical pathways of the first and second integrated device packages are electrically connected to the trace by the second and third terminals. The first terminal and the fourth terminal are electrically connected by way of the first electrical pathway, the trace, and the second electrical pathway.

In one embodiment, the trace includes a surface trace disposed on the system board.

DETAILED DESCRIPTION

Integrated device packages, such as land grid array (LGA) packages, can be mounted to a printed circuit board (PCB), which can serve as a system board or motherboard, that connects devices or packages to a larger electronic system. The system board can include traces that connect pins that are common to all dies, such as power supply lines (VDD), serial-parallel interface (SPI) lines or serial clock (SCLK), etc. The traces can take up valuable space on the system board. For example, the system board may include a via that connects a terminal on a package to a trace in the system board and another via that connects the trace to a terminal on another package, so as to route the signal underneath the package. However, these traces and vias in the system board may require a relatively wide spacing between the packages on the system board. In another configuration of the system board a terminal or a pin on one side of a package surface may be routed to another side of the package surface. In such instance, the system board may include a trace that goes around or under the package.

Some embodiments disclosed herein relate to an integrated device package that includes a laminate substrate with an electrical pathway (e.g., a trace) that connects a pair of common terminals in the laminate substrate, e.g., a pair of terminals that carry the same signal or are at the same voltage. The electrical pathway can include a trace formed on a layer in the laminate substrate (e.g., embedded within the laminate substrate) and vias that are connected to the pair of common terminals. Various embodiments disclosed herein can enable a system board (e.g., a PCB) to mount a higher number of devices or packages as compared to similar devices or packages that do not include the electrical pathway in the laminate substrate. In other words, the electrical pathway in the laminate substrate can enable the mounting of a large number of rows/columns of devices or packages with small space for traces on the system board.

Figure 1:
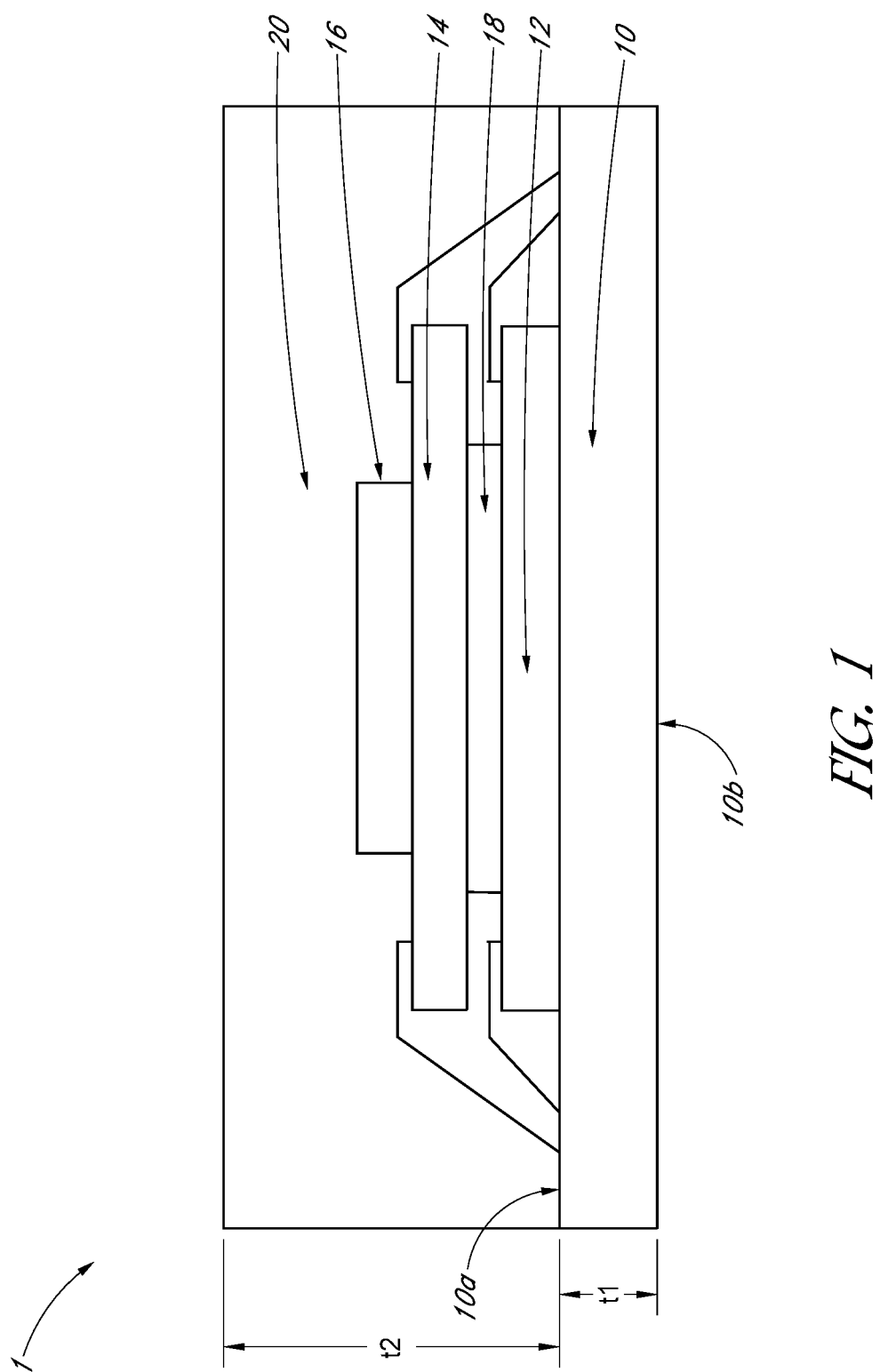
FIG. 1 is a schematic cross sectional side view of a package that includes a laminate substrate.

FIG. 1 is a cross sectional side view of a package 1, according to one example embodiment. The package 1 includes a laminate substrate 10, a first die 12 mounted on a top side 10a of the laminate substrate 10, a second die 14 mounted over the first die 12, and a third die 16 mounted over the second die 14. A spacer 18 can be provided between the first and second dies 12, 14, to provide space for bonding wires that connect the first die 12 to the laminate substrate 10. An encapsulation material 20 can be provided over the dies 12, 14, 16, associated bonding wires, and the top side 10a of the laminate substrate 10. The illustrated package 1 also includes a plurality of bond wires that provide electrical connections between the laminate substrate 10, the first die 12, the second die 14, and the third die 16.

The laminate substrate 10 can include pads (not shown) on the top surface 10a and terminals (not shown) on a bottom side 10b. The laminate substrate 10 can include vias connecting the pads to the terminals. The laminate substrate 10 can include an electrical pathway (e.g., a trace) (not shown) that connects two or more of the terminals.

In some embodiments, the laminate substrate 10 can have a thickness t1 from the top surface 10a to the bottom surface 10b. The thickness t1 of the laminate substrate can be, for example, about 0.35 mm. In some embodiments, the thickness t1 can be in a range of, for example, 0.1 mm to 0.6 mm. The thickness t1 can vary based at least in part on the number of layers within the laminate substrate 10. More details about the laminate substrate 10 are explained below in reference to other figures, for example, FIGS. 3-13.

In some embodiments, the third die 16 can control the first and second dies 12, 14. The third die 16 may be electrically connected to the first die 12 through bond wires connecting the third die 16 to the laminate substrate 10 and bond wires connecting the laminate substrate 10 to the first die 12. The third die 16 may be directly connected to the second die 14 through bond wires.

In some embodiments, the package 1 can comprise an analog switching device. In some embodiments, the package 1 can include two quad single-pole, single-throw (SPST) switches, providing, for example, eight (8) independent switches for the package. For example, the first and second dies 12, 14 can include SPST switches. The package 1 can include a controller, such as a serial-parallel interface (SPI) converter. The controller can be electrically connected to the switches and control the switches. For example, the third die 16 can include a SPI to parallel converter.

In some embodiments, the first, second and third dies 12, 14, 16 can include any type of dies. In some embodiments the first, second and third dies 12, 14, 16 can be connected to another die and/or to the laminate substrate 10 in any suitable manner. For example, the first die 12 can be flip chip mounted to the laminate substrate 10. Of course, the package 1 can include any number of die(s) suitable for the purported use.

In some embodiments, the spacer 18 can assist in mounting the second die 14 that has a similar or greater lateral dimension as the first die 12. The spacer 18 can provide a sufficient gap between the first die 12 and the second die 14 for wire bonding. In some embodiments, the spacer can include silicon, a ceramic, etc. The illustrated package 1 includes one spacer 18 between the first die 12 and the second die 14. However, in some other embodiments, the spacer 18 may be omitted or more spacer(s) can be included in the package 1. For example, a spacer can be provided between the second die 14 and the third die 16, in some embodiments.

The encapsulation material 20 encapsulates the dies 12, 14, 16 mounted on the laminate substrate 10. The encapsulation material 20 can include any suitable material, such as, a plastic molding compound. In some embodiments, the encapsulation material 20 can have a thickness t2. The thickness t2 of the encapsulation material 20 can be, for example, about 1.2 mm. In some embodiments, the thickness t2 can be in a range of, for example, 0.3 mm to 10 mm. The thickness t2 can vary based at least in part on thicknesses and/or the number of die(s) and/or spacer(s) mounted on the laminate substrate 10.

Figure 11:
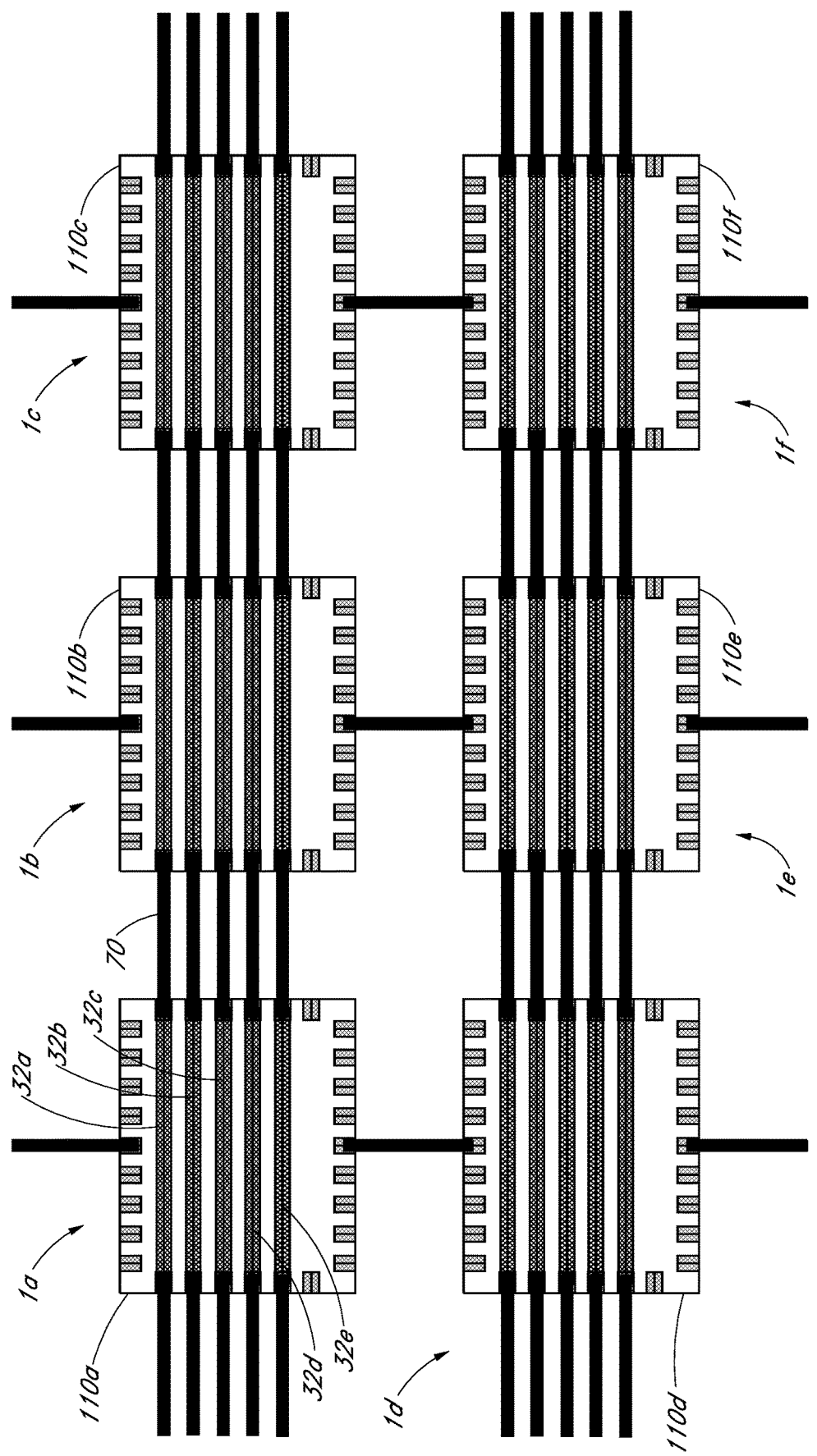
FIG. 11 is a schematic bottom plan view of six package regions connected by jumpers or traces on a system board or motherboard.
Figure 12:
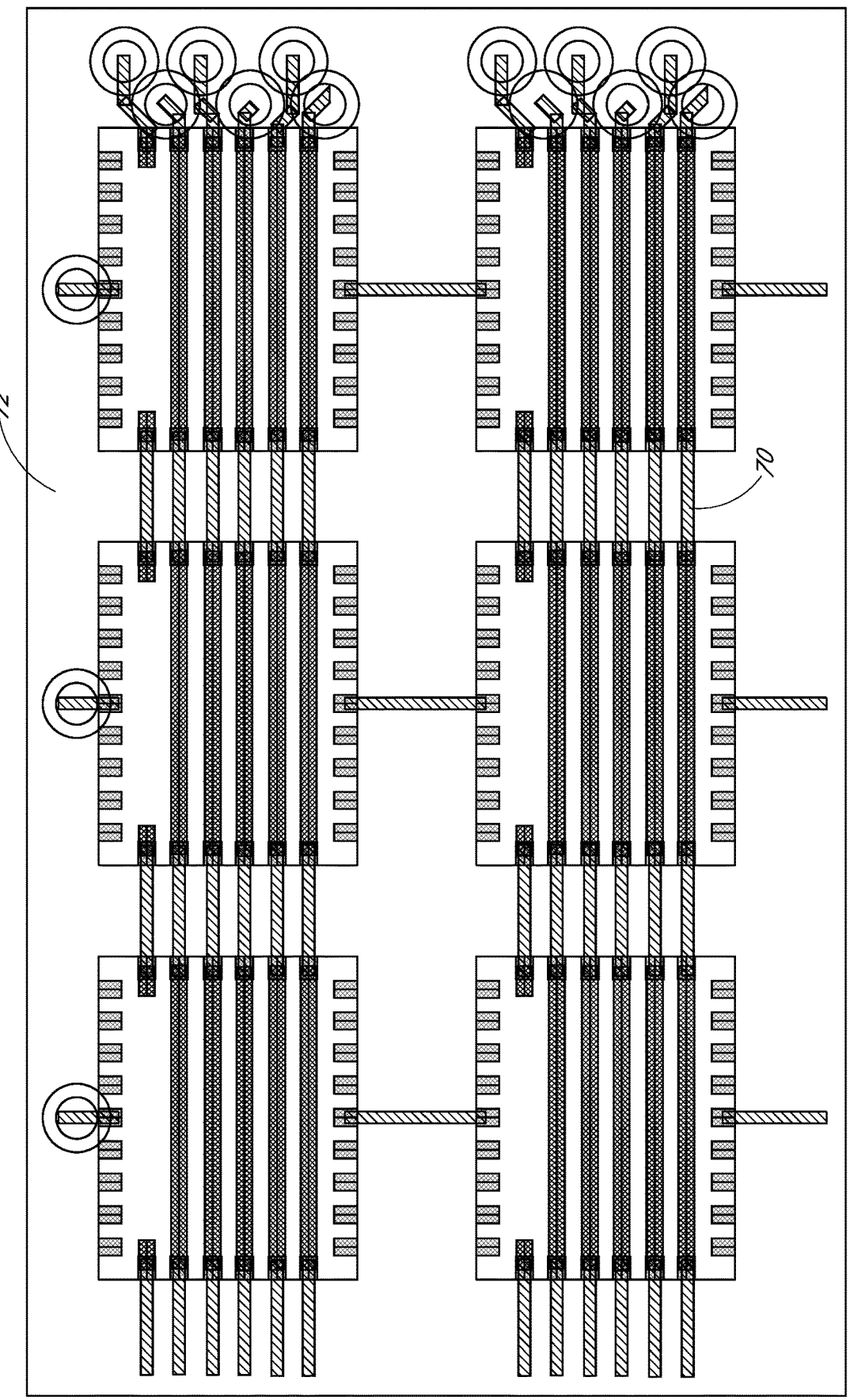
FIG. 12 is a schematic top view of six package regions connected by jumpers or traces on a system board.

The package 1 can be mounted to a system board or motherboard, for example, a printed circuit board (PCB). Two or more packages mounted to the system board can be connected to each other by way of traces or jumpers formed in and/or on the PCB. The connections between the packages according to certain embodiments are illustrated in FIGS. 11 and 12.

Figure 2:
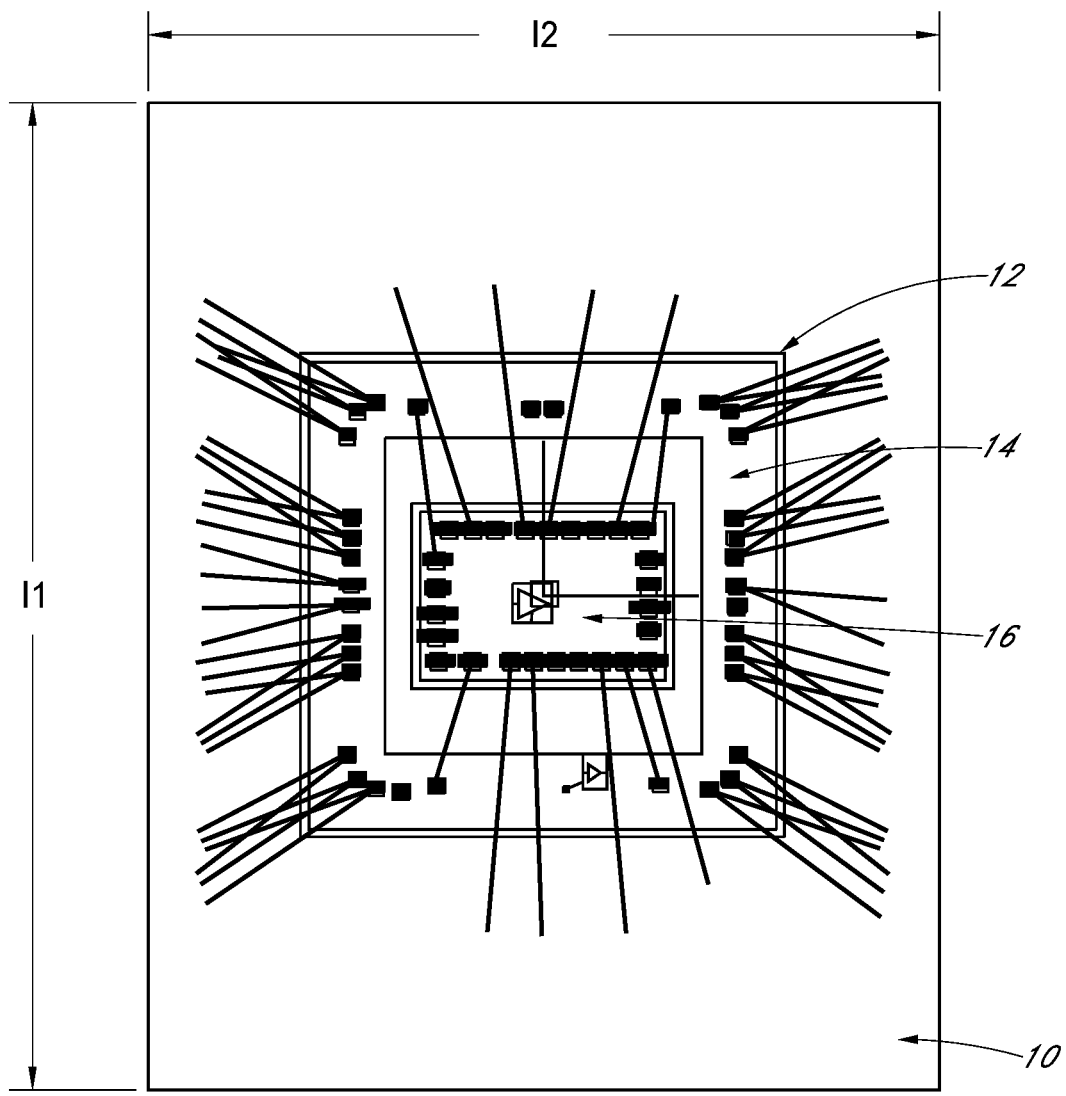
FIG. 2 is a schematic top plan view of the package illustrate in FIG. 1 without a encapsulation material.

FIG. 2 is a top plan view of the package 1 illustrate in FIG. 1 without the encapsulation material. As shown in FIG. 2, the dies 12, 14, 16 are electrically connected to the laminate substrate 10 through a plurality of bond wires. A first side of the package 1 has a first length l1, and a second side perpendicular to the first side has a second length l2. In some embodiments, the first length l1 of the first side of the package 1 can be, for example, about 5 mm. In some embodiments, the first length l1 can be in a range of, for example, 2 mm to 50 mm. In some embodiments, the second length l2 of the second side of the package 1 can be, for example, about 4 mm. In some embodiments, the second length l2 can be in a range of, for example, 2 mm to 50 mm. In some embodiments, a lateral dimension (e.g., the first length l1 and the second length l2) may be determined by a size of the laminate substrate 10. In some other embodiments, a lateral dimension (e.g., the first length l1 and the second length l2) may be determined by a size of the laminate substrate 10 plus a size of the encapsulation material 20.

Figure 3:
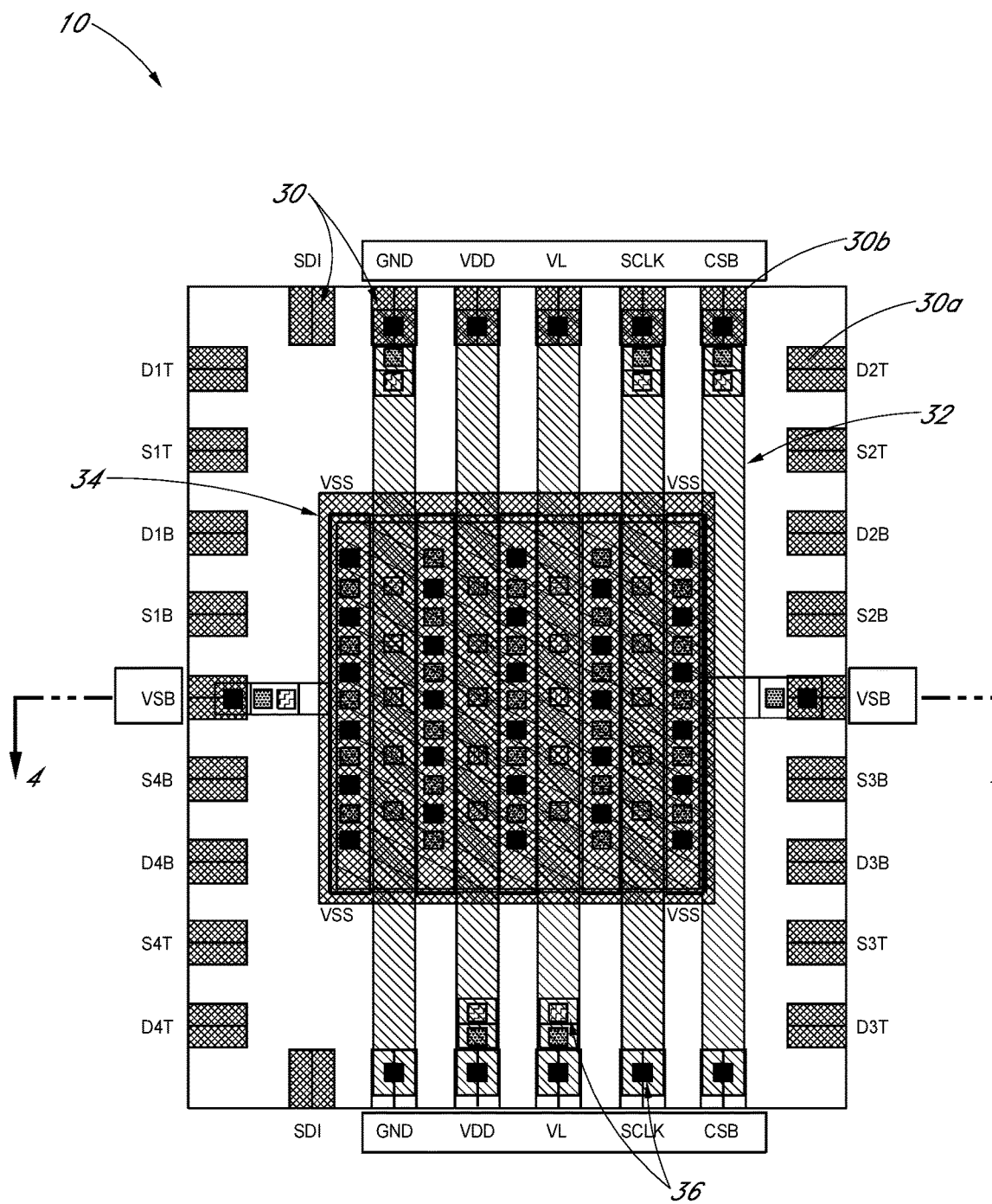
FIG. 3 is a schematic top plan view of the laminate substrate showing an overlay of multiple conductive layers in the laminate substrate, according to one embodiment.

FIG. 3 is a schematic top plan view of the laminate substrate 10 showing an overlay of multiple conductive layers in the laminate substrate 10, according to one embodiment. The illustrated laminate substrate 10 includes a plurality (e.g., thirty) of terminals 30 in a bottom layer of the laminate substrate 10. The terminals 30 can include die input/output (I/O) terminals 30a and common terminals 30b. The common terminals 30b can comprise electrical connections that connect to a common electrical signal or source for an electrical system. For example, in an electrical system that includes a plurality of packages mounted to a system board (e.g., PCB), the common terminals 30b may be configured to connect to a common electrical signal or source used by each package of the plurality of packages. In some embodiments, a first terminal of the plurality of terminals 30 can be an input terminal or a positive terminal and a second terminal of the plurality of terminals 30, which is electrically coupled to the first terminal by way of an electrical pathway, can be an output terminal or a negative terminal.

In some embodiments, the die I/O terminals can include pillars or vias extending from the bottom layer to a top layer of the laminate substrate 10 to connect to, or serve as, bond pads. The bond pads on the top layer can be exposed on the top surface of the laminate substrate 10 and configured to connect to a die though bond wire(s).

In the illustrated embodiment, one of the common terminals 30b is connected to another terminal 30b by way of an electrical pathway. The electrical pathway can include a conductive element. The conductive element can include, for example a trace 32 formed in and/or on a layer of the laminate substrate 10 and/or a die paddle or a conductive plate 34 formed in and/or on a layer of the laminate substrate 10. The electrical pathway can also include vias 36 that electrically connect a layer of the laminate substrate 10 to another layer of the laminate substrate 10. The vias 36 can extend at least partially through a thickness of the laminate substrate 10 to vertically connect conductive layers of the laminate substrate 10.

Figure 4:
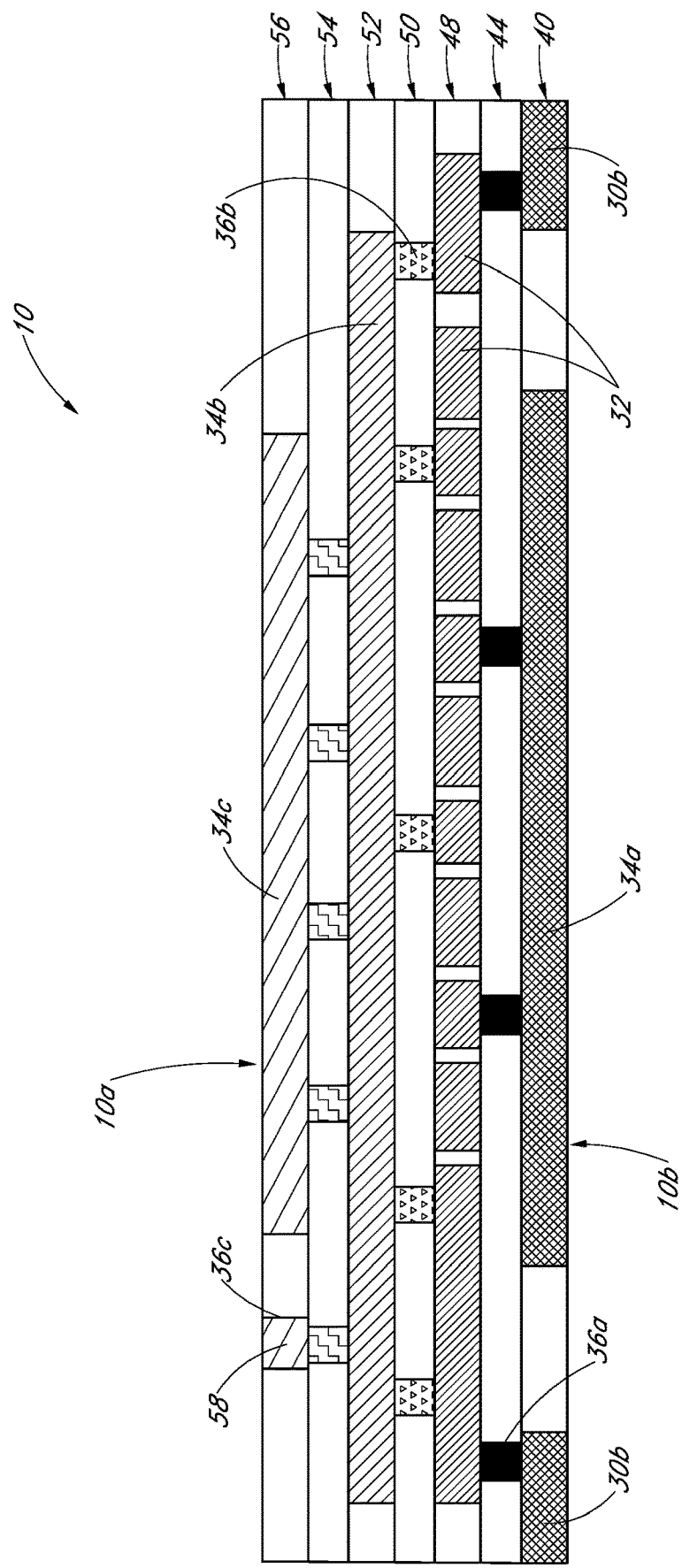
FIG. 4 is a schematic cross sectional side view of the laminate substrate illustrated in FIG. 3.

FIG. 4 is a schematic cross sectional side view of the laminate substrate 10 illustrated in FIG. 3. Each layer in the laminate substrate 10 illustrated in FIG. 4 is described herein with respect to FIGS. 5, 6, 8 and 10. The illustrated laminate substrate 10 includes four layers of metal and three layers of insulators therebetween, but skilled artisans will appreciate that any suitable number of conductive and insulating layers may be provided.

A first layer 40 can include common terminals 30b and a conductive plate 34a. The illustrated common terminals 30b in the first layer 40 can be ground terminals or other types of terminals that are common to other packages in the system. The conductive plate 34a can form or serve as a lower surface of a die paddle or a die pad to which an integrated device die is mounted. The conductive plate 34a can be exposed on the bottom surface 10b of the laminate substrate 10. The conductive plate 34a can be electrically and/or thermally conductive. The conductive plate 34a can be larger than the terminals 30. In some embodiments, the conductive plate 34a can cover, for example, 20% to 80% of the bottom surface 10b. A first insulator 44 of the package 1 can include vias 36a. The vias 36a can provide vertical electrical connections between the first layer 40 and a second layer 48. The first insulator 44 can include insulating material. The insulating material can electrically isolate the vias 36a.

The second layer 48 can include traces 32. The traces 32 can provide horizontal electrical connections between vias (e.g., the vias 36a in the first insulator 44 or vias 36b in a second insulator 50). The vias 36b can provide vertical electrical connections between the second layer 48 and a third layer 52 of the laminate substrate 10. The second insulator 50 can include insulating material. The insulating material can electrically isolate the vias 36b.

The third layer 52 can include a second conductive plate 34b. The laminate substrate 10 can also include a third insulator 54 that includes vias 36c. The vias 36c of the third insulator 54 provides vertical electrical connections between the third layer 52 and the fourth layer 56. The third insulator 54 can include insulating material. The insulating material can electrically separate the vias 36c.

The fourth layer 56 can include a third conductive plate 34c and pads 58. The pads 58 can be configured to connect to a die (e.g., dies 12, 14, 16 illustrated in FIG. 1) mounted to the laminate substrate 10. The pads 58 and the die can be electrically connected by way of bond wires. In other arrangements, the die can electrically connect to the pads 58 by way of a flip chip connection and/or copper pillars.

The conductive plates 34 of the illustrated laminate substrate 10 can beneficially provide sufficient ground connection while providing electrical pathways for the common terminals 30b. In some embodiments, the vias 36 can extend through one or more layers of the laminate substrate 10. For example, the vias 36, instead of providing electrical connection between adjacent layers, can provide direct electrical connections between remote layers.

Figure 5:
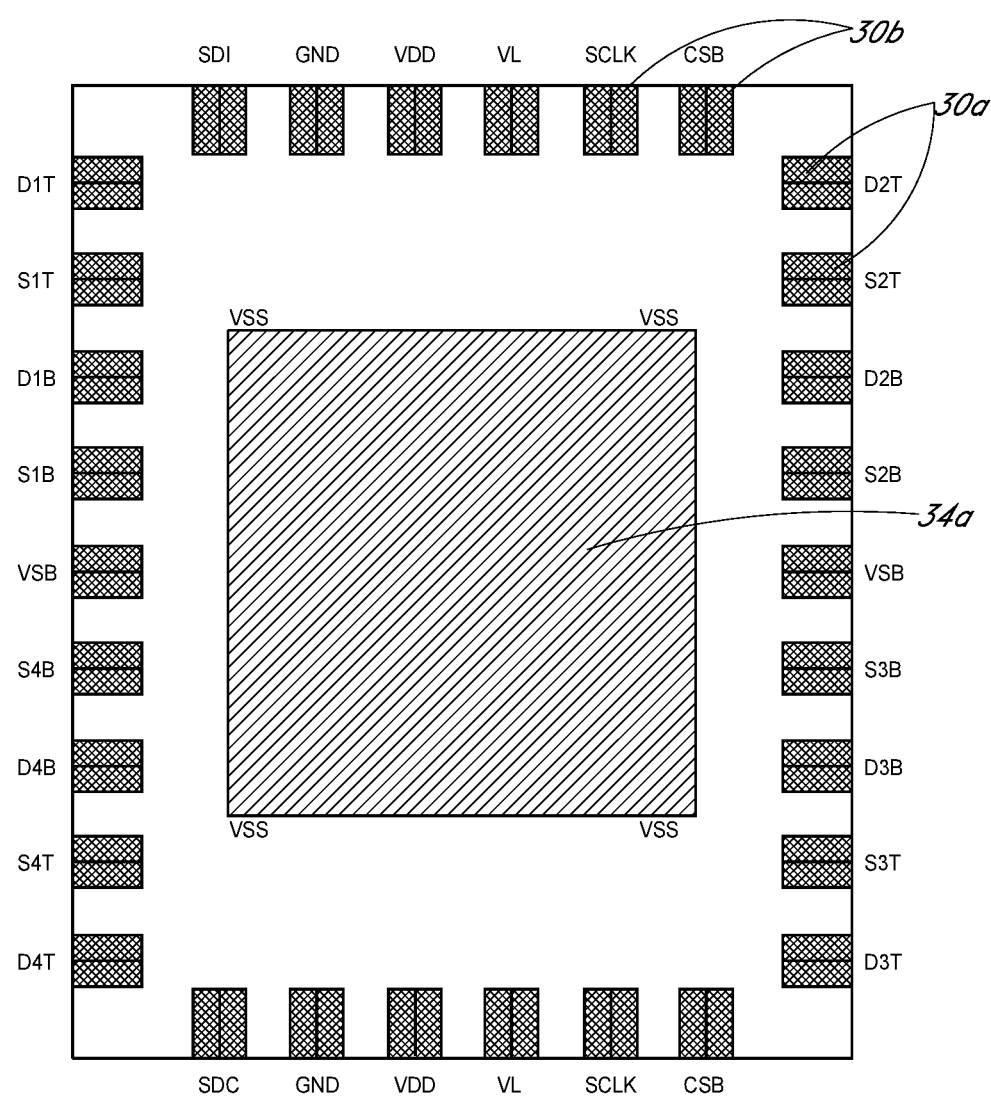
FIG. 5 is a schematic plan view of a first layer of the laminate substrate illustrated in FIGS. 3 and 4.

FIG. 5 is a schematic plan view of the first layer 40 of the laminate substrate 10 illustrated in FIGS. 3 and 4. The illustrated first layer 40 includes eighteen die I/O terminals 30a and twelve common terminals 30b. In the illustrated embodiments, the common terminals 30b include terminals for ground (GND), positive supply voltage (VDD), I/O voltage (VL), serial clock (SCLK), chip select bar (CSB), and negative supply voltage (VSS). The electrical signals provided by these terminals can be utilized or shared by a plurality of packages that are mounted to the system board. In some embodiments, the VSS terminal can provide a ground connection. As explained above, the first layer 40 can also include the conductive plate 34a. The conductive plate may be provided as another VSS terminal of the common terminals 30b. In some embodiments, the laminate substrate 10 can be configured to enable use of any suitable interfaces. For example, the laminate substrate 10 can be compatible with any interfaces, such as inter-integrated circuit (I2C), low voltage differential signaling (LVDS), universal serial bus (USB), controller area network (CAN), etc.

Figure 6:
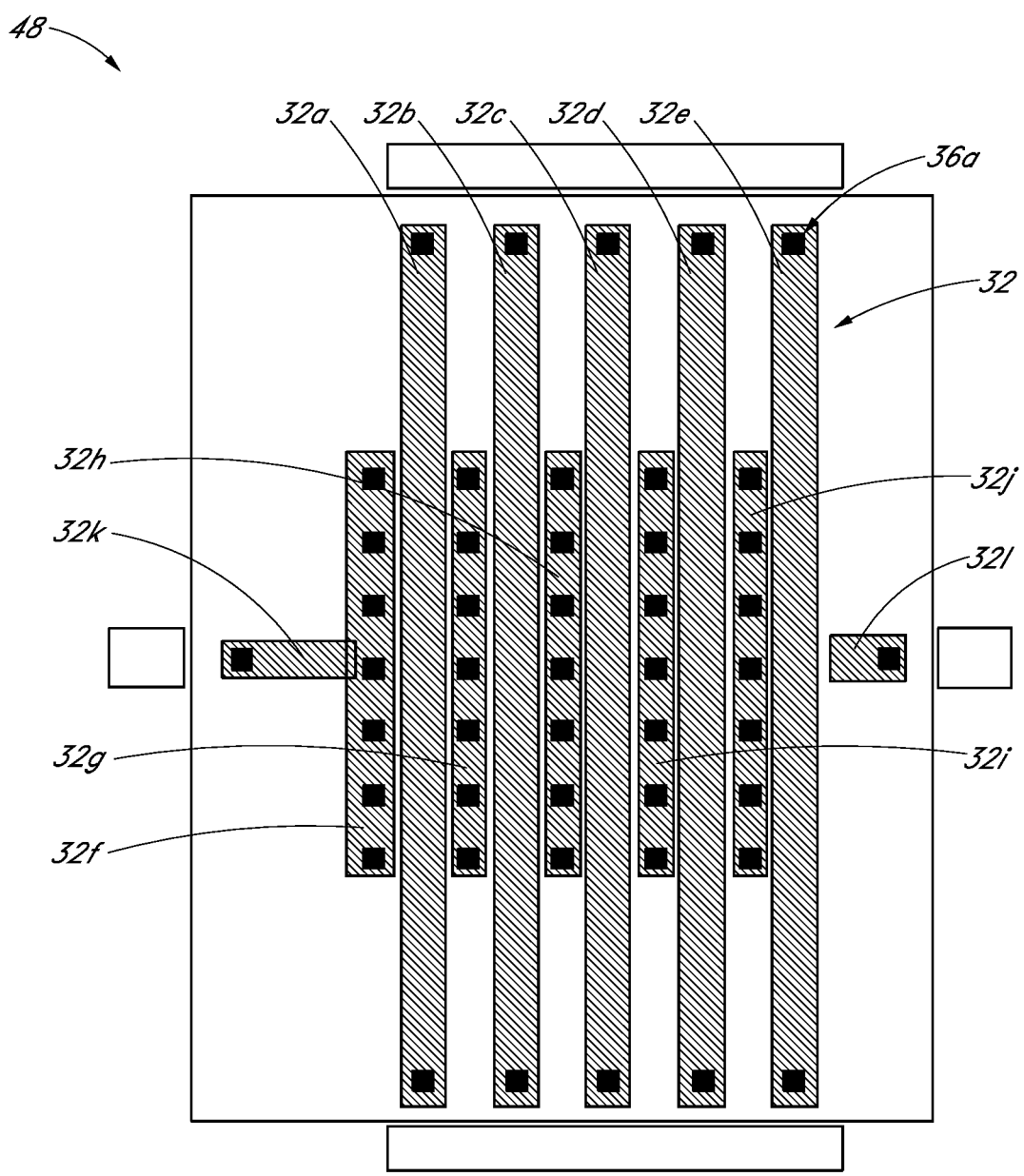
FIG. 6 is a schematic plan view of a second layer and vias of the laminate substrate illustrated in FIGS. 3 and 4.

FIG. 6 is a schematic plan view of the second layer 48 and vias 36a of the laminate substrate 10 illustrated in FIGS. 3 and 4. The second layer 48 includes the traces 32. The illustrated second layer 48 includes five traces 32a, 32b, 32c, 32d, 32e that extend from one end to the other end of the second layer 48. The illustrated second layer 48 also includes five traces 32f, 32g, 32h, 32i, 32j that extend in parallel with the traces 32a, 32b, 32c, 32d, 32e. The illustrated second layer 48 further includes two traces 32k, 32l that extend perpendicular to the other traces 32a-32j. However, the traces 32 can be arranged in any suitable manner.

The vias 36a are formed in the first insulator 44 illustrated in FIG. 4. The vias 36a are disposed between the first layer 40 illustrated in FIGS. 4 and 5 and the second layer 48. The vias 36a can electrically connect portions of the first layer 40 and the second layer 48. For example, the vias 36a can electrically connect common terminals 30b to corresponding traces 32 in the second layer 48.

Figure 7:
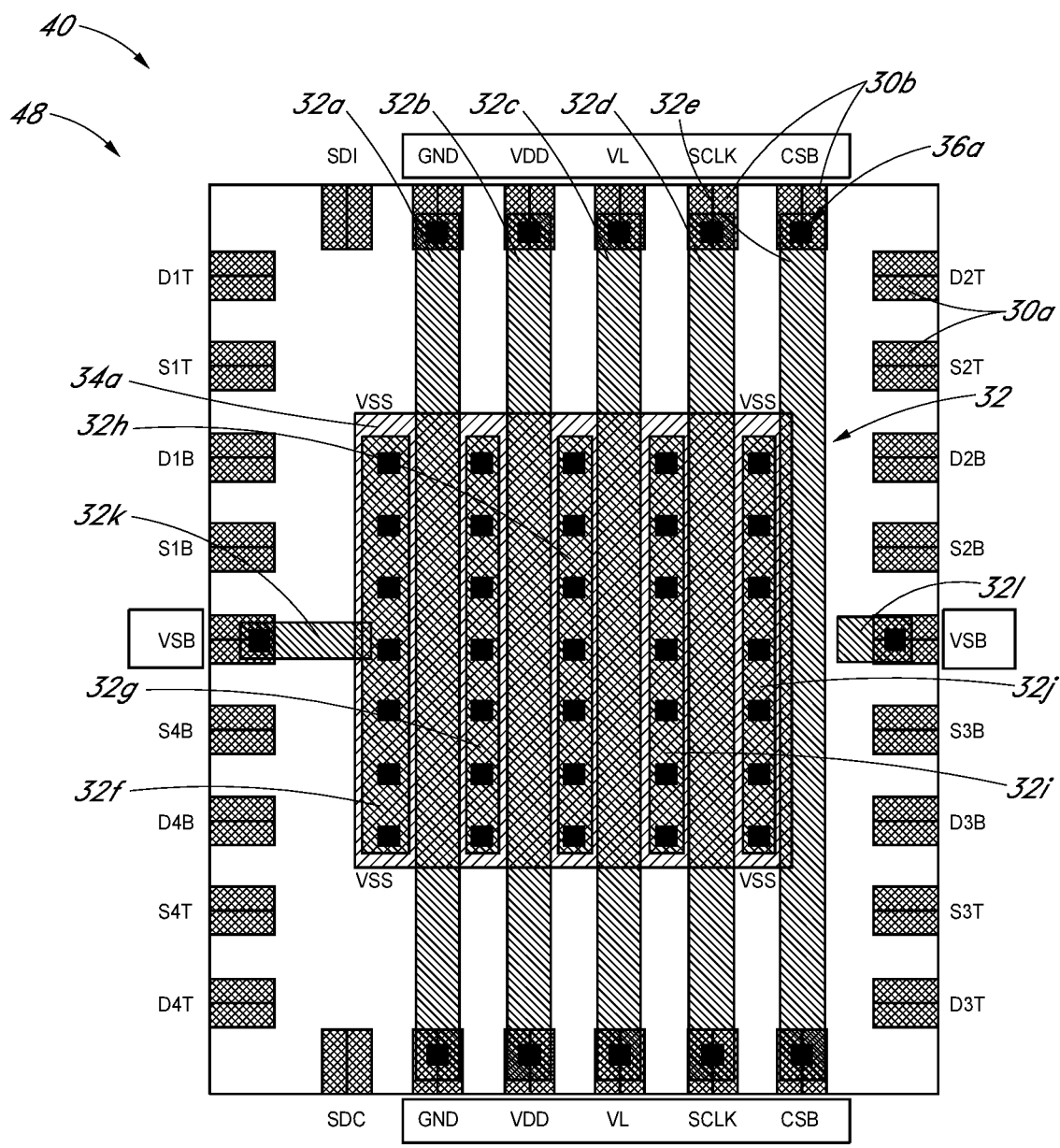
FIG. 7 is a schematic plan view of the first layer and the second layer overlaid on the first layer.

FIG. 7 is a schematic plan view of the first layer 40 and the second layer 48 overlaid on the first layer 40. The traces 32 connect various common terminals 30b. For example, one end of the trace 32a is connected to one of the GND terminals through a via 36a, and the other end of the trace 32a horizontally spaced from the one end of the trace 32a is connected to the other of the GND terminals though another via 36a. Likewise, ends of the traces 32b-32e are connected to pairs of the VDD terminals, the VL terminals, the SCLK terminals, and the CSB terminals.

The illustrated VSS terminals and conductive plate 34a can be coupled differently from the other common terminals. The VSS terminals can be coupled to the traces 32k, 32l through the vias 36a, and the conductive plate 34a can be coupled to the traces 32f-32j through the vias 36a.

Figure 8:
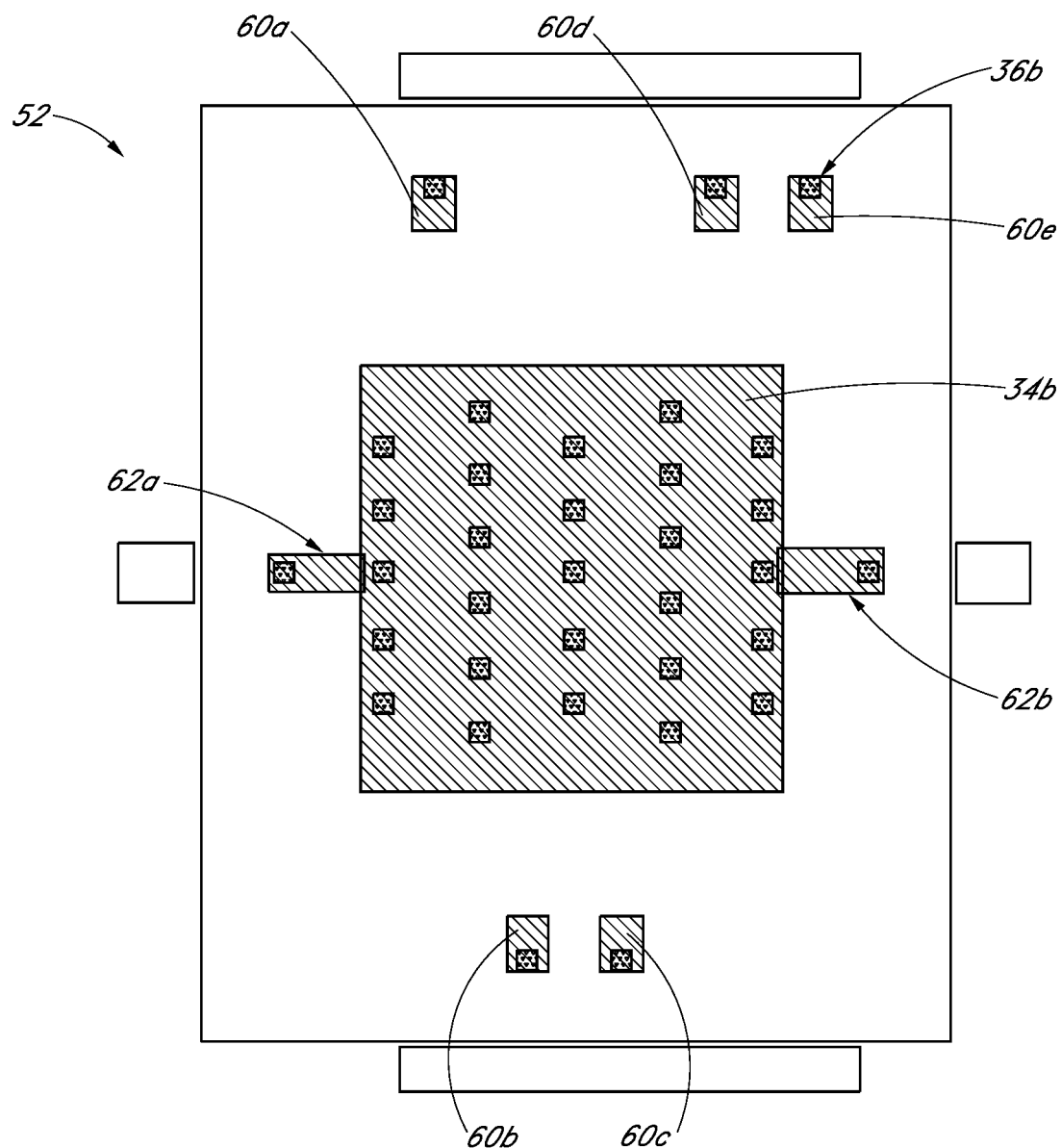
FIG. 8 is a schematic plan view of a third layer and vias of the laminate substrate illustrated in FIGS. 3 and 4.

FIG. 8 is a schematic plan view of the third layer 52 and vias 36b of the laminate substrate 10 illustrated in, for example, FIGS. 3 and 4. The third layer 52 includes conductive plate 34b and traces 60. The traces 60 can help align the vias 36b with the vias 36c illustrated in FIGS. 4 and 10. The illustrated third layer 52 includes traces 60a, 60b, 60c, 60d, 60e. In some embodiments, the third layer 52 can have any suitable number and/or shape of traces. The illustrated conductive plate 34b includes legs 62a and 62b. The legs 62a and 62 can be electrically coupled to traces 32k, 32l on the second layer 48, which are connected to the VSS terminals.

The vias 36b can be formed in the second insulator 50 illustrated in FIG. 4. The vias 36b are disposed between the second layer 48 illustrated in FIGS. 4 and 6 and the third layer 52. The vias 36b can electrically connect portions of the second layer 48 and the third layer 52. For example, the via 36b can connect the trace 32a of the second layer 48 and the trace 60a of the third layer 52.

Figure 9:
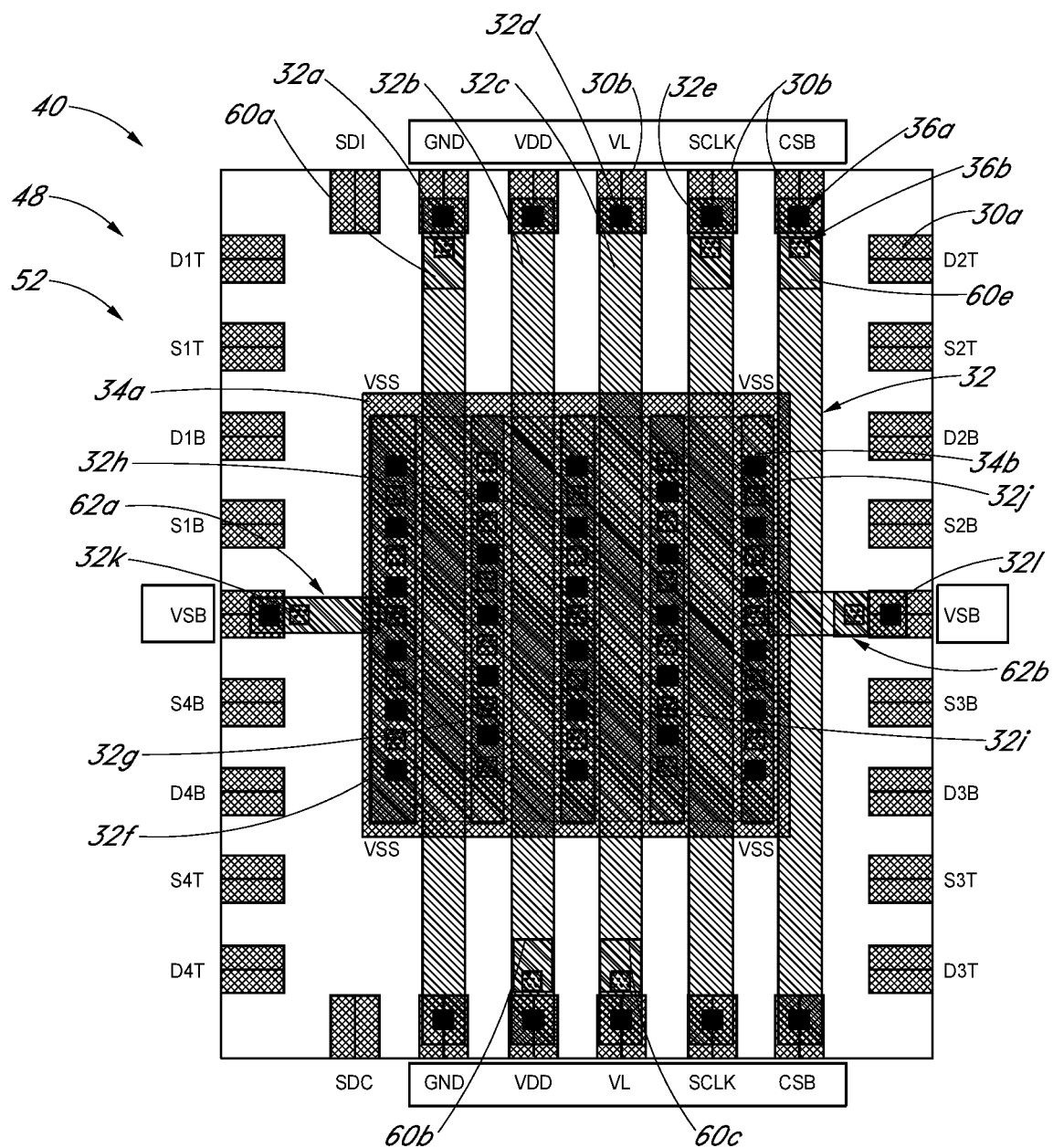
FIG. 9 is a schematic plan view of the first layer, the second layer overlaid on the first layer, and the third layer overlaid on the second layer.

FIG. 9 is a schematic plan view of the first layer 40, the second layer 48 overlaid on the first layer 40, and the third layer 52 overlaid on the second layer 48. As illustrated, the traces 60a-60e on the third layer 52 at least partially overlap with the corresponding traces 32a-32e on the second layer 48 and the traces 60a-60e are electrically connected to the traces 32a-32e respectively though the vias 36b. The conductive plate 34b is electrically coupled with the traces 32f, 32g, 32h, 32i, 32j on the second layer 48 through the vias 36b and the traces 32f, 32g, 32h, 32i, 32j are electrically coupled to the conductive plate 34a, and the VSS, thereby making electrical connections between the conductive plate 34a, and the VSS terminals on the first layer 40.

Figure 10:
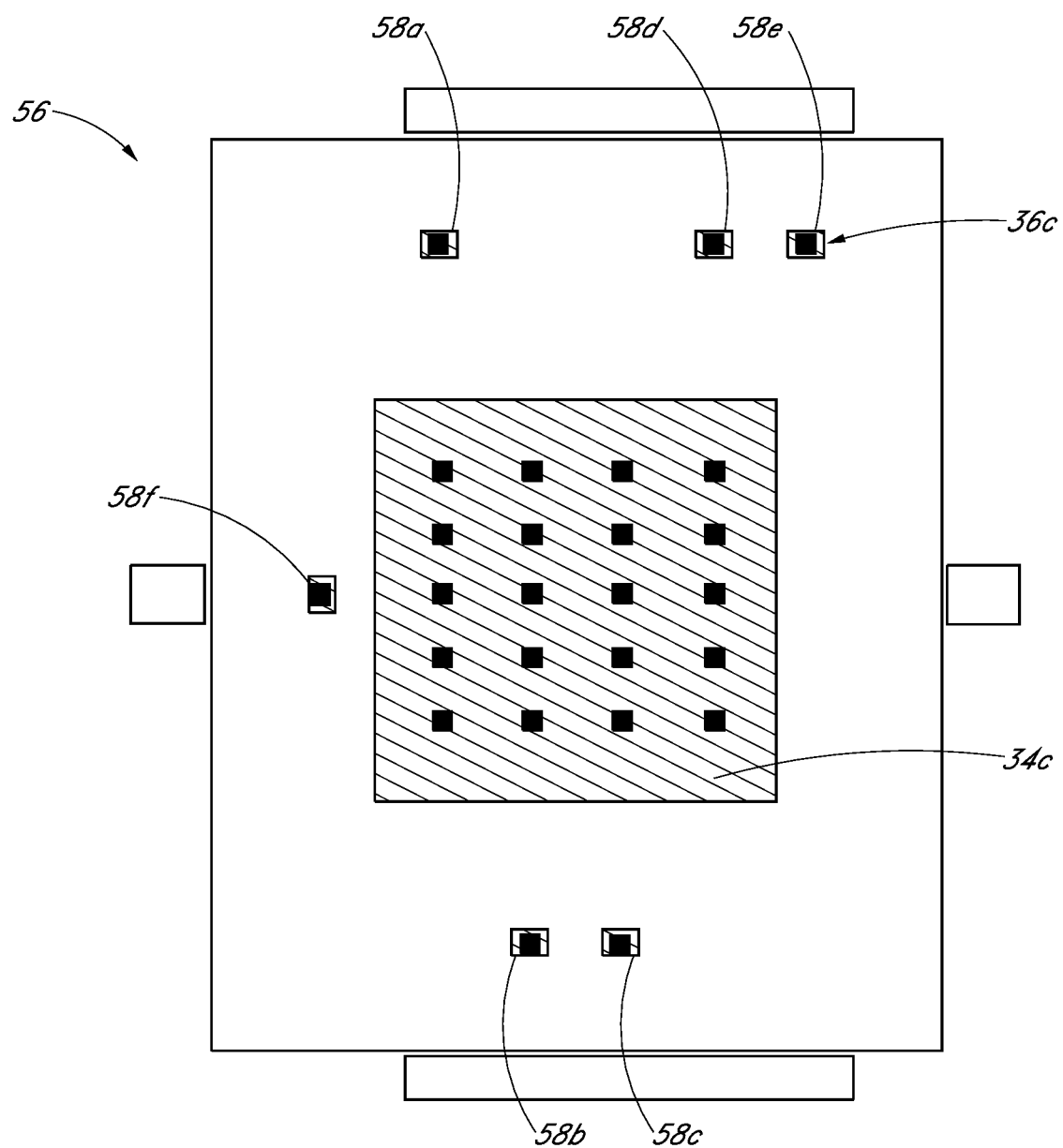
FIG. 10 is a schematic plan view of a fourth layer and vias of the laminate substrate illustrated in FIGS. 3 and 4.

FIG. 10 is a schematic plan view of the fourth layer 56 and vias 36c of the laminate substrate 10 illustrated in, for example, FIGS. 3 and 4. The fourth layer 56 includes conductive plate 34c and pads 58, which can provide electrical communication with the integrated device dies by way of bond wires. The illustrated fourth layer 56 includes pads 58a, 58b, 58c, 58d, 58e, 58f.

The vias 36c are formed in the third insulator 54 illustrated in FIG. 4. The vias 36c are disposed between the third layer 52 illustrated in FIGS. 4 and 8 and the fourth layer 54. The vias 36c can electrically connect portions of the third layer 52 and the fourth layer 56.

Referring back to FIGS. 3, and 6, for example, one of the GND terminals at the top side of the illustrated laminate substrate 10 is electrically coupled with the other one of the GND terminals at the bottom side of the illustrated laminate substrate 10 through the trace 32a and vias 36a. The GND terminals are also electrically coupled with the pad 58a through the traces 32a, 60a, and vias 36a, 36b, 36c.

For example, the VSS terminals and the conductive plate 34a of the first layer 40 are electrically coupled with each other through the traces 32f, 32g, 32h, 32i, 32j, 32k, 32l on the second layer 48, the conductive plate 34b on the third layer 52, and vias 36a, 36b. The VSS terminals and the conductive plate 34a are also electrically coupled with the pad 58f though the traces 32f, 32g, 32h, 32i, 32j, 32k, 32l on the second layer 48, the conductive plate 34b on the third layer 52, and the vias 36a, 36b, 36c.

FIG. 11 is a schematic bottom plan view of six package regions 1a, 1b, 1c, 1d, 1e, 1f connected by jumpers or traces 70 on a system board or motherboard (e.g., a PCB) (not shown). Each package region 1a-1f represents the footprint of a particular package 1 on the system board, and the integrated device dies and other components are not shown for ease of illustration. The traces 32a-32e in laminate substrates 110a, 110b, 110c, 110d, 110e, 110f are shown for the purpose of explanation. The traces 70 can include, for example, surface traces formed on the system board.

FIG. 12 is a schematic top view of six package regions connected by jumpers or traces 70 on a system board 72 (such as a PCB). The electrical pathways formed in the laminate substrates of the packages enable the traces 70 to connect common nodes of one package to another without routing connections through the system board 72. The routing connections though the system board 72 can include, for example, traces embedded in the system board underneath the package regions and vias connecting the common nodes to the traces in the system board. The electrical pathways formed in the laminate substrates of the packages enable the packages to be positioned relatively close to each other. For example, mounting packages that do not include the electrical pathways may occupy about 1 mm extra spacing between each packages as compared to mounting the packages with electrical pathways. For example, a package can have a lateral dimension of 5 mm. In one example, seven (7) packages with the electrical pathway can be mounted to the system board, as compared with six (6) packages that do not utilize the electrical pathway.

Figure 13:
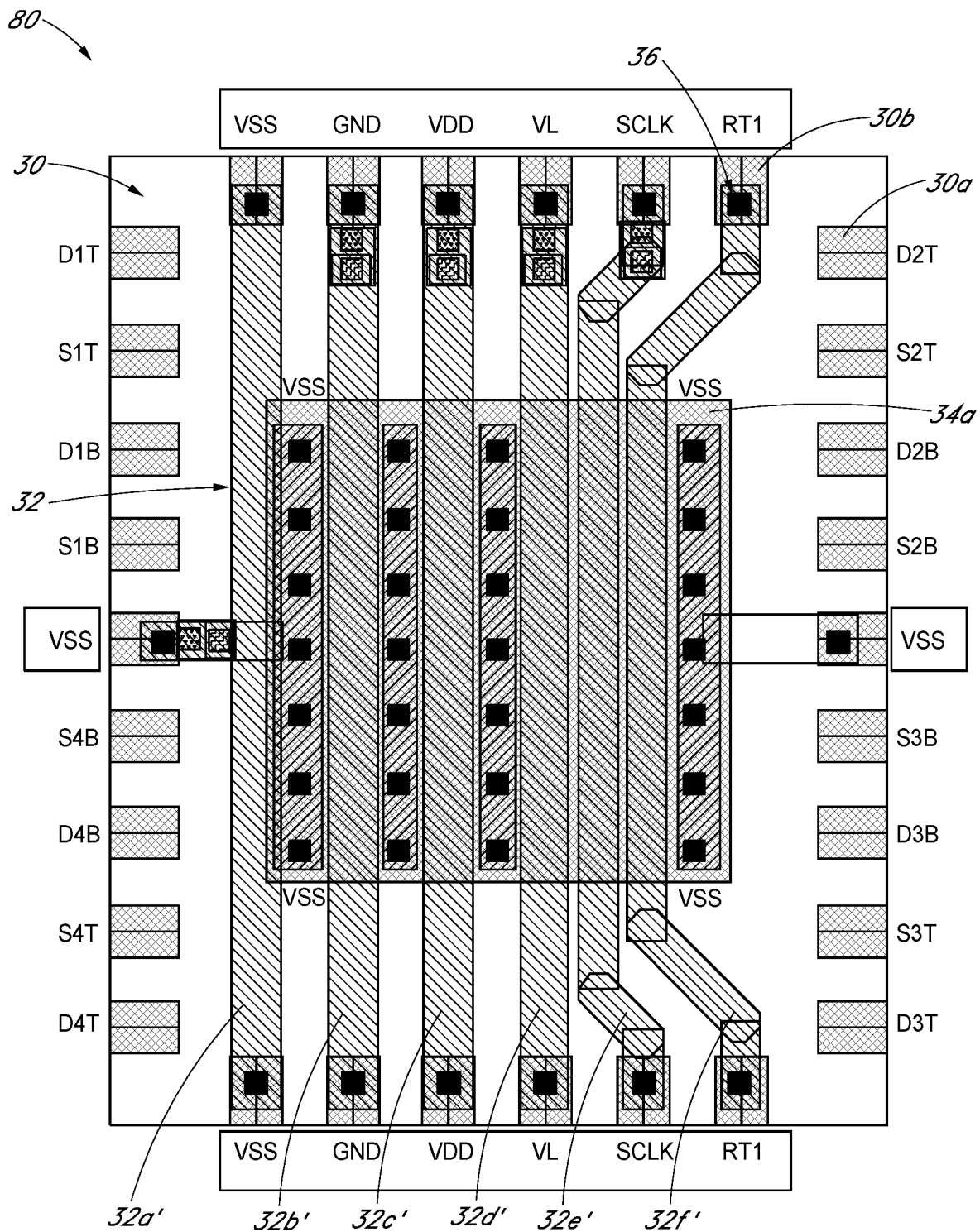
FIG. 13 is a schematic top view of the laminate substrate showing conductive portions of layers in the laminate substrate according to an embodiment.

FIG. 13 is a schematic top view of the laminate substrate 80 showing conductive portions of layers in the laminate substrate 80 according to an embodiment. The illustrated laminate substrate 80 includes thirty terminals 30 in a bottom layer of the laminate substrate 80. The terminals 30 can include die I/O terminals 30a and common terminals 30b.

The laminate substrate 80 illustrated in FIG. 13 is generally similar to the laminate substrate 10 illustrated in FIG. 3. Unless otherwise noted, the components of FIG. 13 may be similar to or the same as like numbered components of FIGS. 3-10. Unlike the embodiment of FIG. 3, the laminate substrate 80 does not have multiple conductive plates. Rather, there is only one conductive plate 34a or a paddle in the laminate substrate 80. The VSS terminals are disposed at all four sides of the laminate substrate 80. As with the laminate substrate 10 in FIG. 3, the laminate substrate 80 includes traces 32a'-32f. However, the trace 32f' is not configured to be electrically coupled to a die that can be mounted to the laminate substrate 80. Instead, the trace 32f' can provide electrical pathway from the top side RT1 terminal to the bottom side RT1 terminal as shown on FIG. 13.

Unless the context clearly requires otherwise, throughout the description and the claims, the words "comprise," "comprising," "include," "including," and the like are to be construed in an inclusive sense, as opposed to an exclusive or exhaustive sense; that is to say, the words should be construed in the sense of "including, but not limited to." The words "coupled" or "connected", as generally used herein, refer to two or more elements that can be either directly connected, or connected by way of one or more intermediate elements. Additionally, the words "herein," "above," "below," and words of similar import, if and when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An integrated device package comprising:
   a laminate substrate comprising:
      a first layer having a first terminal and a second terminal, the first layer having a major lateral surface with a plurality of sides including a first side and a second side different from the first side, the first terminal being disposed at the first side and the second terminal being disposed at the second side;
      a second layer having a conductive element;
      a first via electrically connecting the first terminal to the conductive element; and
      a second via electrically connecting the second terminal to the conductive element to electrically couple the first terminal and the second terminal within the laminate substrate; and
      a die mounted on and electrically connected to the laminate substrate, the die electrically connected to the first terminal through the laminate substrate.

2. The integrated device package of claim 1, wherein the laminate further comprises a top layer having a pad that is electrically coupled to the first terminal, the pad being electrically connected to the die.

3. The integrated device package of claim 1, wherein the conductive element of the second layer comprises a metal trace.

4. The integrated device package of claim 1, wherein the conductive element of the second element is a metal plate.

5. The integrated device package of claim 1, wherein the laminate further comprises a third layer comprising a second conductive element.

6. The integrated device package of claim 1, wherein the first layer comprises a first conductive plate.

7. The integrated device package of claim 6, wherein the first conductive plate comprises a thermally conductive paddle.

8. The integrated device package of claim 7, wherein the thermally conductive paddle is exposed on a bottom surface of the laminate substrate, the bottom surface being opposite to a top surface of the laminate substrate, the die being mounted on the top surface.

9. The integrated device package of claim 1, wherein the first layer comprises a third terminal and a fourth terminal, the second layer comprises a second conductive element, the third terminal and the fourth terminal being electrically coupled through the second conductive element.

10. The integrated device package of claim 1, wherein the first layer comprises a third terminal and a fourth terminal, the first, second, third, and fourth terminals are electrically coupled through the conductive element of the second layer.

11. The integrated device package of claim 1, wherein the first terminal is connected to a terminal of another integrated device package through a jumper formed in or on a circuit board such that the terminal of the other package, the first terminal, and the second terminal are electrically coupled, the jumper comprises a surface trace.

12. The integrated device package of claim 1, wherein the die comprises a switch die.

13. The integrated device package of claim 12, wherein the switch die comprises a quad single pole single-throw (SPST) die.

14. The integrated device package of claim 13, further comprising a second die disposed over the first die and a third die disposed between the first and second dies, the second die comprises a controller configured to control the first die, the controller comprises a serial-parallel interface (SPI) converter, the third die comprises a second quad SPST die, the second die configured to control the third die.

15. A laminate substrate comprising:
   a first layer having a first terminal and a second terminal, the first layer having a major lateral surface with a plurality of sides including a first side and a second side different from the first side, the first terminal being disposed at the first side and the second terminal being disposed at the second side;
   a second layer having a conductive element;
   a third layer having a pad configured to connect to an integrated device die;
   a first via electrically connecting the first terminal to the conductive element; and
   a second via electrically connecting the second terminal to the conductive element,
   wherein the first terminal is electrically connected with the pad.

16. The laminate substrate of claim 15, wherein the conductive element of the second layer comprises a metal trace.

17. An integrated device package comprising:
   a laminate substrate having a top surface and a bottom surface opposite the top surface, the laminate substrate comprising:
      a first terminal and a second terminal on the bottom surface;
      a pad on the top surface; and
      an electrical pathway for electrically coupling the first and second terminals; and
      a die electrically connected to the pad on the top surface of the laminate substrate, the die electrically connected to the first terminal,
      wherein the bottom surface has a plurality of sides that includes a first side and a second side different from the first side, the first terminal is disposed at the first side and the second terminal is disposed at the second side.

18. The laminate substrate of claim 17, wherein the electrical pathway comprises a first via and a conductive element electrically coupled with the first via and the first terminal such that the conductive element and the first terminal are electrically connected by way of the first via.

19. The laminate substrate of claim 18, wherein the electrical pathway further comprises a second via electrically connecting the conductive element and the second terminal.

20. The integrated device package of claim 1, wherein the first layer has a rectangle shape with four sides, the first side is opposite the second side.

* * * * *